Nov. 6, 1962 G. C. DACEY ET AL 3,063,023

MODULATED OSCILLATOR AND LOW IMPEDANCE DIODE CONSTRUCTION THEREFOR

Filed Nov. 25, 1959

3 Sheets-Sheet 1

INVENTORS G. C. DACEY
R. L. WALLACE, JR.
BY Harry C. Hart
ATTORNEY

Nov. 6, 1962 G. C. DACEY ETAL 3,063,023

MODULATED OSCILLATOR AND LOW IMPEDANCE DIODE CONSTRUCTION THEREFOR

Filed Nov. 25, 1959

3 Sheets-Sheet 2

INVENTORS G. C. DACEY
R. L. WALLACE, JR.
BY Harry C Hart
ATTORNEY

Nov. 6, 1962 G. C. DACEY ET AL 3,063,023

MODULATED OSCILLATOR AND LOW IMPEDANCE DIODE CONSTRUCTION THEREFOR

Filed Nov. 25, 1959

3 Sheets-Sheet 3

INVENTORS G. C. DACEY
R. L. WALLACE, JR.
BY Harry C. Hart
ATTORNEY

3,063,023
MODULATED OSCILLATOR AND LOW IMPEDANCE DIODE CONSTRUCTION THEREFOR

George C. Dacey, Murray Hill, and Robert L. Wallace, Jr., Warren Township, Somerset County, N.J., assignors to Bell Telephone Laboratories, Incorporated, New York, N.Y., a corporation of New York
Filed Nov. 25, 1959, Ser. No. 855,426
15 Claims. (Cl. 332—29)

This invention relates to a low impedance diode structure, to a method of fabricating it, and to circuitry constructed therefrom. Its general object is to realize the ultrahigh frequency, low noise capability of diodes formed from heavily doped semiconductor materials. Such diodes display a current-voltage characteristic with a voltage-controlled, negative resistance region which is operative at high frequencies. Their behavior is described more fully in a copending application, Wallace, Serial No. 845,274, filed October 8, 1959. Unlike conventional diodes, those employed in the invention inherently present an impedance of small magnitude with the consequence that stray effects will unduly limit achievable operating frequencies unless special fabrication and circuit techniques are employed. It is also an object of the invention to facilitate the utilization of ultrahigh frequency diodes by minimizing the impedance of a diode and mount having a prescribed geometry.

A further object of the invention is to accomplish the transmission and amplification of an ultrahigh frequency signal along a waveguide formed as an integral unit from an extended, heavily doped semiconductor diode.

A still further object of the invention is to obtain low noise, ultrahigh frequency oscillations or amplification by a compact, completely solid state device. This is accomplished with a novel coaxial line arrangement requiring a minimal number of components. The coaxial line oscillator of the invention is able to drive microwave circuits, such as parametric amplifiers. It is frequency-modulated according to the invention by being subjected to pressure variations or changes in the inductance of the diode mount.

The low impedance diode structure of the present invention is characterized by having a diode assembly and a mounting which, for a structure of prescribed size, minimize the composite effect of intrinsic capacitance, lead inductance and lead resistance. The diode assembly is formed by alloying a metal with a semiconductor wafer through a channel in a dielectric separator to produce a p-n junction. Intrinsic capacitance is directly proportional to junction area, and it is lowered by reducing the channel opening. The alloying metal covers the separator and acts in combination with a metallic layer placed between the separator and the wafer, but spaced from the junction, to provide the equivalent of a radial transmission line with closely spaced, low-loss conductors which simultaneously lower lead inductance and resistance. The resulting diode is positioned within a low inductance mounting consisting of two components separated by a thin dielectric separator. The mounting may accommodate ferrimagnetic elements, and the diode is held in place by two pins, one of which has a flexible diaphragm for making pressure adjustments.

In one embodiment of the invention high frequency operation is realized with minimal circuitry by making the low impedance diode structure a center conducting segment of a coaxial line that is short-circuited at one end. When generating sustained oscillations, the negative resistance of the diode serves to cancel the power dissipation in the positive resistance of the load at the coaxial input terminals and, for a given diode, the frequency of oscillation is determined by the short inductive path provided by the diode mount. A bias resistor energized at the coaxial input is so located that it dissipates minimum radio frequency energy and provides low frequency stabilization by preventing the formation of stray inductive paths which could cause nonsinusoidal relaxation oscillations. When employed with a circulator, the coaxial arrangement allows high frequency amplification.

A high frequency waveguide is readily evolved from the diode structure by giving it dimension in depth. The diode is elongated in a direction perpendicular to its preexisting cross section, and the result is a distributed parameter transmission line which is directly adaptable as an amplifier or oscillator.

The manner in which the invention accomplishes the above-mentioned objects can be more clearly apprehended from a consideration of the description of a few preferred embodiments taken in conjunction with the drawings in which.

Figure 1:
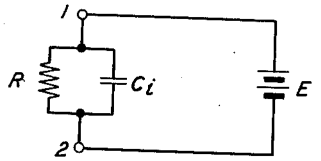
FIG. 1 is an idealized equivalent circuit diagram for a high frequency, voltage-controlled negative resistance diode.

The invention may be best understood by beginning with a consideration of the idealized equivalent circuit of a voltage-controlled negative resistance diode. In FIG. 1 a battery furnishes a supply voltage E across the terminals 1 and 2 of a forward biased, heavily doped diode symbolically represented by a resistor of resistance R in parallel with a capacitor of intrinsic capacitance $C_1$. The resistance R is of small magnitude which is positive or negative depending upon the magnitude of voltage E. On the other hand, because of the factors which create a negative resistance region in the current-voltage characteristic, the capacitance $C_1$ is of much larger magnitude than that heretofore found in microwave semiconductor diodes. As a result, attempts to raise the operating frequency of devices serving as diode oscillators and switching circuits are hindered by the large $C_1$ and the added consequence of stray impedances accompanying increasing frequency. For example, the upper frequency limit of a negative resistance diode oscillator is governed by the interaction of inductance and capacitance with the result that a minimization of these parameters is necessary in order to reach the theoretical maximum governed by the resistance-capacitance product of a given diode. The need for small magnitude lead inductance with switching diodes has been demonstrated in the copending Wallace application. Furthermore, it is generally desirable to reduce interference from thermal noise generators by lessening parasitic resistance.

Figure 2:
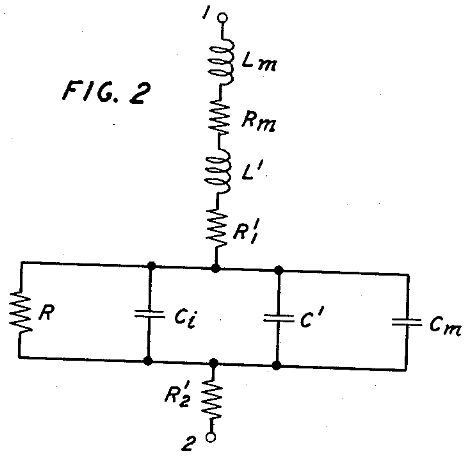
FIG. 2 is an approximate equivalent circuit diagram for a diode whose idealized equivalent circuit is given in FIG. 1.

The modifications required in the ideal circuit of FIG. 1 because of microwave parasitic effects are shown in FIG. 2. They result from the inescapable physical fact that every functioning diode must have leads and a mount of finite size. Associated with each lead is a distributed parameter resistance and inductance which may be represented by the series combination of an inductor and a resistor of resistance $R_1'$ and inductance L′, respectively. The resistance $R_1'$ at the upper terminal 1 in FIG. 2 generally differs from its counterpart, resistance $R_2'$, at the lower terminal 2. In a typical case the upper terminal is metallic and the lower terminal is the semiconductor itself with the result that the symbol $R_2'$ identifies the combined effect of semiconductor skin resistance and spreading resistance. Lead capacitance C′ is present in shunt with the diode intrinsic capacitance $C_i$. Other stray effects comparable to those discussed in conjunction with the diode leads manifest themselves when the diode is placed in its mount. They are represented by the resistance $R_m$, inductance $L_m$ and capacitance $C_m$.

Figure 3:
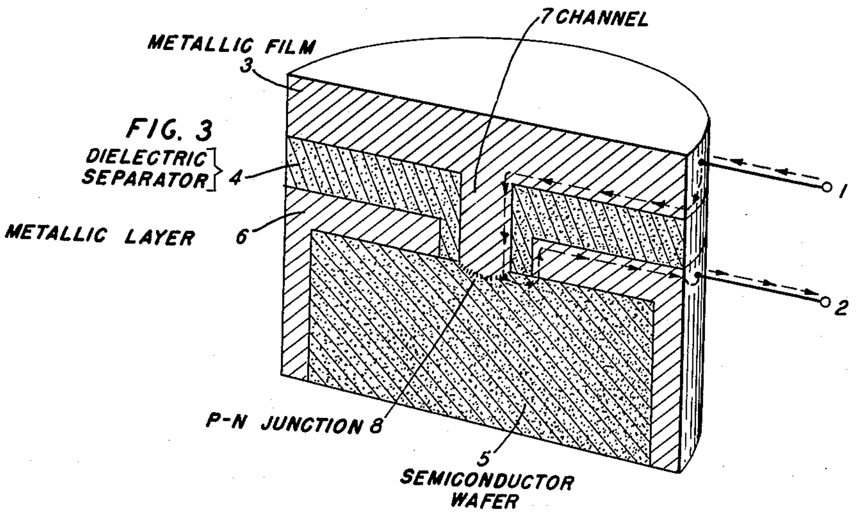
FIG. 3 is a perspective cross sectional view of a low impedance spot diode formed by alloying a metal through a hole of minute diameter in order to form a p-n junction with a semiconductor wafer.

In its first aspect the invention minimizes the net consequence of the impedance limitations imposed by the need for leads and mount by producing a "spot" diode assembly of the type depicted in FIG. 3. The designation spot diode refers to the minute area of a p-n junction constructed for maximum frequency, low noise performance. A metallic film 3 deposited on a dielectric separator 4, spaced from a semiconductor wafer 5 by a metallic layer 6, is alloyed with the wafer through a channel 7 in the separator to form a p-n junction 8. The alloying takes place near the base of a slender column of the metallic film extending into the channel 7. Intrinsic capacitance is directly proportional to the area of the p-n junction 8. It is reduced by making the aperture diameter minute, the only restriction being that the aperture be sufficiently large to allow formation of an active junction. The resulting configuration may be compared with a radial transmission line having disk-like conductors, the metallic film 3 and the metallic layer 6, extending on both sides of the p-n junction 8. A typical one of the many current paths converging at the junction 8 is illustrated by the arrows commencing at the input terminal 1 and terminating at the output terminal 2 in FIG. 3. Since microwave operation is contemplated, the currents will be of the surface variety with but a slight skin depth. By permitting only a small number of flux linkages per unit of current, a close spacing of the conductors results in an inductance L′ (see FIG. 2) of small magnitude which is approximately directly proportional to the distance of separation. While the accompanying capacitance C′ is large, in representative cases its magnitude is insubstantial when compared with the large intrinsic magnitude of $C_i$, even as reduced to a minimum. Of significance is the fact that the close spacing of conductors would be undesirable with conventional microwave diodes since their intrinsic capacitance is of such small magnitude that any added capacitance effect would offset any inductance advantage. Regarding the reduction of parasitic resistance, the diode assembly makes a twofold contribution. First: the minimization of junction area to lower intrinsic capacitance is attended by an increase in the magnitude of intrinsic negative resistance, thereby making it more difficult for parasitic factors to dominate. This is due to the fact that for a given level of doping the resistance-capacitance product of the diode remains constant, although even with the smallest of junctions the intrinsic resistance remains small as compared with that of conventional microwave diodes. Second: circuit resistance directly determines the magnitude of generated thermal noise voltage which may be reduced to provide the diode with a desirable low noise capability.

As is apparent from FIG. 3 the principal resistive effect in the diode assembly is attributable to the spreading resistance near the p-n junction and the skin effect resistance along the surface of the semiconductor. By placing the metallic layer 7 close to junction 8, the skin effect is rendered negligible and the spreading resistance reduced considerably. A collar of the dielectric separator may be interposed between the metallic layer 6 and the column of the metallic film 3 to prevent the short-circuiting that would result from touching contact of the junction 8 with the layer 6. The collar is not needed if the alloying temperature does not cause excessive spreading of the column. The metallic layer 6 may coat the sides as well as the surface of the wafer 5 in order to assure positive ohmic contact at the lower terminal 2.

The steps in the fabrication of a typical low impedance diode assembly are taken in the following manner. A metallic layer is placed on the surface of a semiconductor wafer. Superimposed on this, by wetting in the case of glass or by evaporation in the case of silicon oxide, is a thin dielectric separator. A tiny channel is etched away near the center of the separator with an acid, such as hydrofluoric, through a photoresistant mask. If the layer is an oxide which has been grown on the semiconductor, it may be as thin as a few thousand angstroms. Once there is a channel through the separator, it is next necessary to etch away a cavity in the metallic layer by an acid, such as hydrochloric, in the case of nickel, or a base, such as sodium hydroxide, in the case of aluminum, neither of which reacts with semiconductor materials. Then, a film of metal, such as aluminum with boron addition, in the case of n-type germanium or silicon, is vapor-deposited over the surface of the thin dielectric separator. The film extends into the separator channel to form a protuberance which is in contact with the wafer surface. The separator is chosen to withstand not only the subsequent alloying temperature but the soldering operations needed later. If the alloying temperatures and materials make possible a short-circuit contact between the p-n junction and the metallic layer, a modification in the fabrication process is necessary. After etching away the cavity from the metallic layer, a dielectric material is deposited through the separator channel to coat the side walls of the caivty. Should the cavity be filled with dielectric material, as a result, the hydrofluoric acid etch is reapplied in order to extend the channel to the wafer surface. Alternatively, after placement of the metallic layer a cavity may be etched therefrom so that a subsequently formed channel in the dielectric separator superimposed on the layer and extending into the cavity of the layer will be surrounded by a dielectric collar. For the last-named procedure two photoresistant masks are required, one in conjunction with formation of the cavity and another in conjunction with the formation of the channel.

The design of a low impedance diode is but a first step. In its second aspect the invention provides a low impedance mounting to incorporate the diode at a predetermined position in the low inductance structure of FIG. 4. In the mounting portion of FIG. 4 there are two metallic holders 9 and 10 spaced from each other by a dielectric separator 17, preferably of the same thickness and composition as that used in the diode itself. The inductance considerations for the mount are similar to those discussed in conjunction with the diode. For a mount of a specified outside diameter, inductance is reduced as the dielectric separator is made thinner. If the inductance-capacitance product is to be of small magnitude, as is desirable with a high frequency oscillator, a limiting condition is reached when a further decrease in inductance, accompanied as it is by a corresponding increase in capacitance, results in excessive dielectric losses. Furthermore, the increase in capacitive magnitude attending a reduction in inductive magnitude creates, for the radial transmission line of the diode structure, a characteristic impedance of small magnitude, making it difficult, in some microwave circuits, to match the structure to its load.

Figure 4:
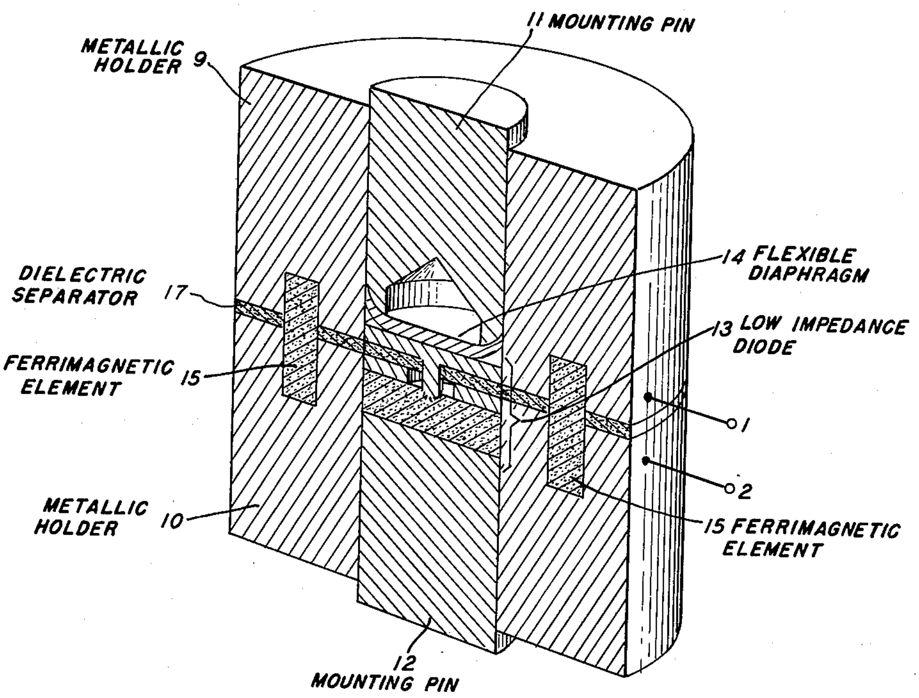
FIG. 4 is a perspective cross sectional view of a low impedance diode structure formed by emplacing the spot diode of FIG. 3 within a low inductance mounting.

The pins 11 and 12 of the mounting in FIG. 4 are inserted into their respective passages in the holders 9 and 10 to properly position the diode assembly 13 of the kind depicted in FIG. 3. Pin 11 has a flexible diaphragm 14 to establish positive contact with the upper terminal of diode 13. The kind of diaphragm contemplated is disclosed in the application of D. E. Iglesias, Serial No. 758,996, filed September 4, 1958, now Patent No. 2,928,-031. Ferrimagnetic elements 15 provide means for varying lead inductance when that is desirable.

The process for assembling a typical low impedance diode structure involves the following steps: first, the pins and holders are usually made of the same metal, such as brass, nickel or Kovar, to eliminate problems associated with differential expansion when temperature cycling takes place. Second, the holders are joined together by a thin dielectric separator. In a tested model the separator was an epoxy resin, less than one thousandth of an inch thick, manufactured and sold under the name, "Bondmaster M620." Other appropriate materials are metallized ceramics which are mechanically stable and able to withstand temperature cycling, thin plates of sapphire, high density alumina or a thin layer of glass. Third, indexing means are provided on pins 11 and 12. The first assures that the dielectric separator of the diode shall be in perfect alignment with that of the mount. The second facilitates application of the correct pressure by diaphragm 14 to the top of the diode assembly. Fourth, the diode assembly is fastened, usually by soldering, to the pin 11 which is inserted into its passage in holder 9 to the indexed position. Fifth, pin 12 is inserted into its channel in holder 10 to the indexed position corresponding to the amount of pressure to be applied to the diode in order to establish positive contact and control negative resistance magnitude without causing fracture.

Figure 5:
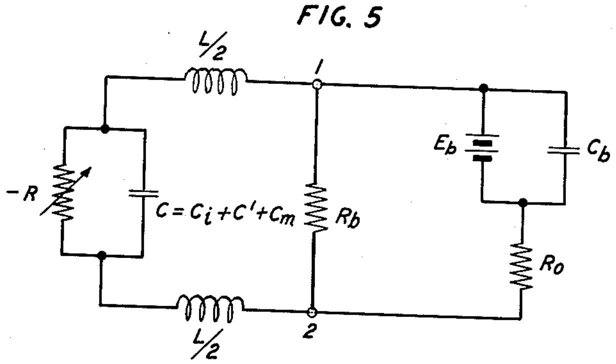
FIG. 5 is a schematic diagram of a high frequency oscillator circuit employing the low inductance diode structure of FIG. 4.

Illustrative of the way the low impedance diode structure may be employed according to the invention is an ultrahigh frequency oscillator whose equivalent circuit diagram is illustrated in FIG. 5. A biasing resistor of resistive magnitude $R_b$ is placed across terminals 1 and 2 of a diode structure with a variable negative resistance $-R$. The inductance L is furnished entirely by the diode leads and the capacitance C represents the collective effect of intrinsic and parasitic effects. Stray resistance from the leads is assumed negligible. The bias supply is from a source of voltage $E_b$ shunted by a high frequency bypass condenser $C_b$. This combination is in series with a radio frequency output load represented by resistance $R_0$. In normal high frequency operation there is presented across the terminals 1 and 2 an equivalent load whose magnitude is cancelled by the negative resistance $-R$ so that sustained oscillations ensue. The complex frequency $s$ for the circuit of FIG. 5 is obtained by solving the determinant of the loop or node equations and is in the form:

$$s=\sigma_0\pm j\omega=\sigma_0\pm j\sqrt{\beta-\sigma_0^2} \qquad (1)$$

where:

$$\sigma_0=\frac{1}{2}\left(\frac{1}{CR}-\frac{R_s}{L}\right) \qquad (2)$$

$$\beta=\frac{1}{LC}\left(1-\frac{R_s}{R}\right) \qquad (3)$$

and $R_s$=the magnitude of the composite radio frequency resistance presented at terminals 1 and 2 of the diode in FIG. 5. The other symbols indicate the magnitude of the parameters identified in FIG. 5. There will be a signal buildup if $$\sigma_0>0 \text{ or } \frac{1}{RC}>\frac{R_s}{L}$$

The buildup will be oscillatory if $\beta>0$ or $R_s<R$ and the oscillation will be sinusoidal if $\beta>\sigma_0^2$. At equilibrium $\sigma_0=0$ or $$\frac{1}{RC}=\frac{R_s}{L}$$

and the radian frequency of oscillation is given by:

$$\omega=\sqrt{\frac{1}{LC}\left(1-\frac{R_s}{R}\right)} \qquad (4)$$

While the inductance L should be made small, the theoretical upper limit is given by the equilibrium condition for which $\sigma_0=0$ or $L=R_sRC$. Consequently, the upper limiting frequency for the oscillator occurs when R is much larger than $R_s$ and the radian frequency becomes:

$$\omega=\sqrt{\frac{1}{R_sRC^2}} \qquad (5)$$

Figure 6:
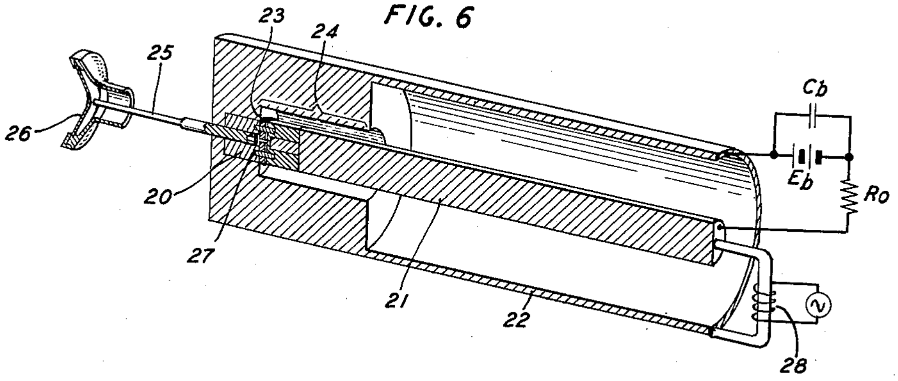
FIG. 6 is a perspective cross sectional view of the microwave embodiment of the oscillator of FIG. 6 adapted for maximum frequency operation and frequency modulation by means of a variable pressure device or variable magnetic biasing of a ferrimagnetic element.

In the construction of practical circuits difficulty is encountered when the inductance L becomes too large. Then $\sigma_0^2>\beta$ and as is indicated by Equation 1 the diode operates in its nonsinusoidal mode. This possibility is present when the bias resistor $R_b$ is placed physically far from the diode. Even if the conditions for high frequency operation are theoretically present, there is also a long inductive path between the diode and its biasing resistor which will dominate any shorter and consequently higher frequency path. To avoid the danger of these relaxation oscillations and simultaneously achieve a compact, minimum component oscillator, the coaxial line arrangement of FIG. 6 is employed. The spot diode structure 20 of FIG. 4 is made an extension of the inner conductor 21 of a short-circuited coaxial outer conductor 22. A bias resistor 23 is formed by a film of resistive material deposited at the outer edges of the dielectric separator between the holder mounts. The film extends completely across the edge of the separator to assure the presence of the resistance $R_b$ directly across the diode terminals 1 and 2 as indicated in FIG. 5. As so placed the resistor permits bias voltage $E_b$ to be applied directly across the diode terminals. The close placement of the bias resistor causes the effective resistance between terminals 1 and 2 to be, for long inductive paths, the parallel combination of the diode negative resistance and the bias resistance so that if the bias resistance is smaller than the negative resistance, the net resistive effect between the terminals is positive and no oscillations are sustainable. This procedure accordingly stabilizes the oscillator against the spurious oscillation occasioned by the presence of long inductive paths.

A quarter-wave transformer 24 is placed between the inner and outer conductors of the coaxial line commencing at the short-circuit termination. By virtue of having a characteristic impedance which is of small magnitude as compared with that of the line, the transformer prevents the needless dissipation of radio frequency energy in the bias resistor. It also converts load impedance $R_0$ into one of small magnitude at the diode terminals as required for sustained oscillations according to Equation 1.

Laboratory experiments have indicated that the diode is piezoelectric in nature with the result that pressure applied to it causes a change in energy gap which in turn produces a variation in diode current so that the net result is equivalent to a lowering of the intrinsic resistance of the diode. Consequently, a high frequency waveform generated by the oscillator may have its frequency varied through the use of a pressure-sensitive device attached to pin 25. Diaphragmatic or similar means 26 with companion circuitry to modify the pressure variation as desired are adequate. Variations in pressure are transmitted to the diode to change the magnitude of intrinsic negative resistance $-R$ and modify generated frequency as indicated in Equation 5. Frequency modulation may also be produced by placing a ferrimagnetic element 27 in the cavity space of the diode and biasing that element with a variable source 28 of magnetic potential.

Figure 7:
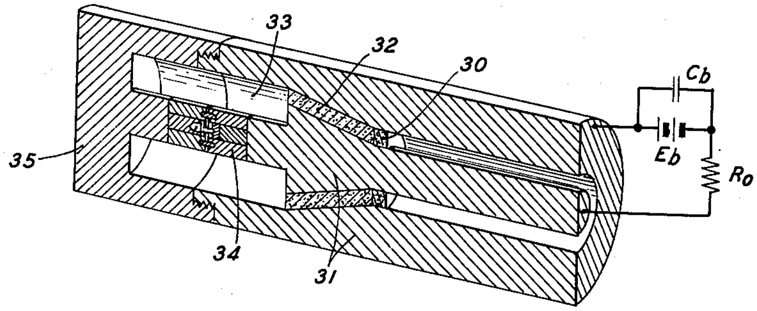
FIG. 7 is a perspective cross sectional view of a microwave oscillator employing the low impedance structure of FIG. 5 and having a detachable cavity and a broadbanded output.

A modification of the coaxial line oscillator of FIG. 6 is illustrated in FIG. 7. The bias resistor 30, consisting of a resistive disk between the inner and outer conductors of a coaxial line 31, is placed in front of a dielectric film 32 which acts as a bypass for the frequency determining cavity 33 surrounding the low impedance diode structure 34. The cap 35 is detachable to allow alterations in cavity size. By making the capacitance created by the dielectric 32 of sufficiently large magnitude that it stabilizes the oscillator against the possibility of relaxation oscillations at the lowest frequency of interest, like stabilization is thereby assured at higher frequencies.

Figure 8:
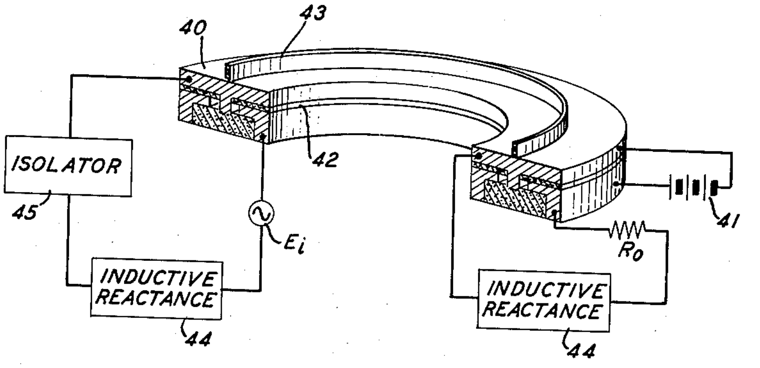
FIG. 8 is a perspective view of a microwave distributed parameter transmission line formed by extending the diode of FIG. 3.

The invention may be applied to achieve an ultrahigh frequency transmission system by means of the extended line diode of FIG. 8. In lateral cross section the diode 40 of FIG. 8 is identical with the diode 13 of FIG. 4. It differs only by being extended in depth so that its parameters must be calculated on a per unit length basis. The p-n junction is of minute width in accordance with the conditions previously prescribed for minimization of intrinsic capacitance, but the extension of the junction enhances power capability. The bias voltage source 41 is effectively bypassed by dielectric separator 42. Ridge 43 allows a variable pressure to be applied to the extended p-n junction so that changes in distributed parameter negative resistance may be made at selected points along the line as would be desirable in certain forms of frequency modulation. As depicted, the curvilinear structure of FIG. 5 may be energized at its input terminals by a signal $E_1$ which is propagated without attenuation to the load $R_0$. Since the characteristic impedance of the line is complex, inductive reactances 44 must be placed at both input and output positions in order to prevent voltage reflections. An isolator 45 is added to provide nonreciprocal performance.

What is claimed is:

1. An ultrahigh frequency diode assembly which comprises a semiconductor wafer, a dielectric separator overlying a surface of said wafer, said separator being of a material that is insensitive to alloying temperatures and having an aperture therein, a metallic film covering said separator, said film having a protuberance integral therewith and extending through said aperture, and an alloy junction between said wafer and said film.

2. A high frequency diode assembly having a voltage-controlled negative resistance region in its current-voltage characteristic, which comprises a semiconductor wafer, a metallic layer substantially overlying the upper and side surfaces of said wafer, a thin dielectric separator upon said metallic layer, said separator being coextensive with said upper surface and having a channel of minute width therein, a metallic film upon and coextensive with said separator, said film having a protuberance integral therewith and extending into said channel, an alloyed junction between said upper surface of said wafer and the base of said protuberance, and spacing means for preventing short-circuiting contact of said metallic layer with said junction, thereby to form, for a wafer of prescribed size, an assembly exhibiting a parasitic impedance of small magnitude and generating a negligible thermal noise voltage at microwave frequencies.

3. Apparatus as defined in claim 2 wherein said channel comprises a conduit extending through said separator at a right angle thereto, the area of said junction being limited by the aperture size of said conduit and co-ordinated with the thickness of said separator thereby to achieve for said diode assembly an inductance-capacitance product of small magnitude, said inductance being dependent upon said thickness and said capacitance being dependent upon said thickness and said area.

4. Apparatus as defined in claim 2 wherein said channel comprises a long groove in the plane of said separator thereby to increase the power capability of said assembly, the width of said junction being limited by the width of said groove and co-ordinated with the thickness of said separator to achieve for said diode assembly an inductance-capacitance product per unit length of small magnitude, said inductance being dependent upon said thickness and said capacitance being dependent upon said width and said thickness.

5. Apparatus as defined in claim 2 wherein said spacing means comprises a collar of dielectric material enclosing said protuberance in the plane of said metallic layer.

6. A cylindrical diode assembly having a voltage-controlled negative resistance region at microwave frequencies, which comprises a semiconductor disk, an annular metallic disk upon said semiconductor disk and in close contact therewith, said metallic disk being an output terminal of said assembly, a dielectric separator, with a circular opening therein, upon and concentric with said metallic disk, the inner diameter of said separator being less than that of said metallic disk, a metallic film coextensive with and overlying said annular separator and extending through said opening, said metallic film being an input terminal of said assembly and forming a metallic column spaced from said metallic disk and in alloying contact with said semiconductor disk, each of said disks being of the same prescribed outer diameter, whereby there is presented at microwave frequencies between said input and output terminals an impedance of small magnitude, said impedance comprising an intrinsic capacitance component proportional to the inner diameter of said separator, a lead inductance component proportional to the thickness of said separator and a parasitic resistance component proportional to the inner diameter of said metallic layer.

7. A compact low inductance waveguide structure for the propagation of ultrahigh frequency energy, which comprises a semiconductor slab of rectangular cross section in the plane perpendicular to the propagation direction of said energy, a metallic member enclosing three sides of said rectangular cross section and having a lower surface thereof in contact with an upper surface of said slab, a channel dividing said member into two distinct segments, said channel extending along said propagation direction, a dielectric separator overlying the upper surface of said member, a channel in said separator of less width than that in said member, a metallic outer conductor upon said separator and extending into said separator channel to form with said slab an extended p-n junction, the proportions of said separator thickness, of said separator channel width, and of said metallic layer channel width being co-ordinated to control the intrinsic capacitance per unit length, inductance per unit length and resistance per unit length, respectively, of said waveguide structure.

8. A low impedance diode structure for ultrahigh frequency operation, which comprises a diode assembly as defined in claim 3 and mounting means comprising two distinct holders each with a passage therethrough, a first pin with said diode assembly mounted at an apex thereof, said first pin being snugly inserted into one of said passages to a position establishing continuity between a surface of said mounting means and the interface between said separator and said metallic layer of said diode assembly, a second pin with a metal diaphragm at one end thereof, said second pin being inserted into the remaining one of said passages with said diaphragm exerting a preassigned pressure against said metallic film of said assembly, and a thin dielectric separator spacing said holders from each other whereby said mounting means provides, for holders of prescribed size, a minimal augmentation of the parasitic inductance and resistive effects exhibited by said diode assembly.

9. Apparatus as defined in claim 8 wherein said holders and said pins are cylinders of revolution and said dielectric separator is an annular disk of thickness so proportioned that the inductance-capacitance product of said structure is of small magnitude.

10. A high frequency oscillator which comprises a section of coaxial line with concentric inner and outer conductors, a low impedance diode structure as defined in claim 9 between adjacent segments of said inner conductor, a short-circuiting termination joining a first one of said segments and the outer conductor of said line, a resistive element connected in shunt with said structure, a voltage source and a load connected between a second one of said segments and said outer conductor, said source developing in said element a bias for said assembly, and means for simultaneously bypassing said element and matching said assembly to said load.

11. Apparatus as defined in claim 10 wherein said resistive element comprises a resistive coating extending across the gap between said holders and said matching and by-passing means comprises a coaxial transformer section commencing in the vicinity of said element and extending for a distance equal to one quarter of a wavelength at the resonant frequency of said oscillator.

12. Apparatus as defined in claim 10 wherein said resistive element comprises a resistive disk between said inner and outer conductors and said matching and bypassing means comprises a dielectric disk extending between said conductors.

13. Apparatus as defined in claim 10 further including means for varying the pressure applied to said structure through said pin whereby the output signal of said oscillator is frequency-modulated.

14. Apparatus as defined in claim 10 further including ferrimagnetic elements disposed between said holders and magnetic bias means for establishing and varying the magnetic field applied to said elements thereby to change the inductance of said structure and frequency-modulate said oscillator in response to the signal applied to said magnetic bias means.

15. A high frequency diode assembly which comprises a semiconductor wafer, a metallic layer substantially overlying the upper surface of said wafer, a thin dielectric separator upon said metallic wafer, said separator being coextensive with said upper surface and having a minute aperture therein, a metallic film upon and coextensive with said separator, said film having a protuberance extending into said aperture, and an alloy junction between said upper surface of said wafer and the base of said protuberance.

References Cited in the file of this patent

UNITED STATES PATENTS

| | | |
|---|---|---|
| 2,680,220 | Starr et al. | June 1, 1954 |
| 2,734,154 | Pankove | Feb. 7, 1956 |
| 2,829,422 | Fuller | Apr. 8, 1958 |
| 2,842,831 | Pfann | July 15, 1958 |
| 2,852,746 | Scheele | Sept. 16, 1958 |
| 2,879,480 | Reed | Mar. 24, 1959 |